(12) United States Patent
Ota et al.

(10) Patent No.: US 10,446,227 B2
(45) Date of Patent: Oct. 15, 2019

(54) READ CIRCUIT FOR A VARIABLE RESISTANCE MEMORY DEVICE

(71) Applicant: Toshiba Memory Corporation, Minato-ku (JP)

(72) Inventors: Kensuke Ota, Tama (JP); Masamichi Suzuki, Tokyo (JP); Reika Ichihara, Yokohama (JP)

(73) Assignee: Toshiba Memory Corporation, Minato-ku (JP)

( * ) Notice: Subject to any disclaimer, the term of this patent is extended or adjusted under 35 U.S.C. 154(b) by 0 days.

(21) Appl. No.: 15/911,413

(22) Filed: Mar. 5, 2018

(65) Prior Publication Data

US 2019/0088324 A1 Mar. 21, 2019

(30) Foreign Application Priority Data

Sep. 20, 2017 (JP) ................................. 2017-180479

(51) Int. Cl.
| | |
|---|---|
| *G11C 13/00* | (2006.01) |
| *G11C 7/18* | (2006.01) |
| *G11C 11/56* | (2006.01) |

(52) U.S. Cl.
CPC ............ *G11C 13/0007* (2013.01); *G11C 7/18* (2013.01); *G11C 11/5685* (2013.01); *G11C 13/004* (2013.01); *G11C 13/0028* (2013.01); *G11C 13/0069* (2013.01); *G11C 2013/0057* (2013.01); *G11C 2213/15* (2013.01); *G11C 2213/31* (2013.01); *G11C 2213/32* (2013.01); *G11C 2213/51* (2013.01); *G11C 2213/54* (2013.01); *G11C 2213/72* (2013.01); *G11C 2213/76* (2013.01); *G11C 2213/77* (2013.01)

(58) Field of Classification Search
None
See application file for complete search history.

(56) References Cited

U.S. PATENT DOCUMENTS

| | | | | |
|---|---|---|---|---|
| 9,576,652 | B1 * | 2/2017 | Lim | G11C 13/004 |
| 2005/0078505 | A1 * | 4/2005 | Voshell | G11C 7/06 365/148 |
| 2011/0267874 | A1 * | 11/2011 | Ryu | G11C 11/1675 365/158 |
| 2012/0069625 | A1 | 3/2012 | Wada | |
| 2014/0119107 | A1 * | 5/2014 | Cha | G11C 11/1673 365/158 |
| 2016/0148684 | A1 * | 5/2016 | Lin | G11C 13/0026 365/148 |
| 2017/0047107 | A1 * | 2/2017 | Berger | G11C 11/1677 |

FOREIGN PATENT DOCUMENTS

JP 2012-69602 4/2012

* cited by examiner

*Primary Examiner* — J. H. Hur
(74) *Attorney, Agent, or Firm* — Oblon, McClelland, Maier & Neustadt, L.L.P.

(57) ABSTRACT

According to one embodiment, a memory device includes: a memory cell including a variable resistance element and connected between a word line and a bit line; and a control circuit configured to control an operation of the memory cell. The variable resistance element includes: a first layer including a first compound including oxygen; a second layer including a second compound including oxygen; and a third layer between the first layer and the second layer.

16 Claims, 6 Drawing Sheets

READ CIRCUIT FOR A VARIABLE RESISTANCE MEMORY DEVICE

CROSS-REFERENCE TO RELATED APPLICATIONS

This application is based upon and claims the benefit of priority from Japanese Patent Application No. 2017-180479, filed Sep. 20, 2017, the entire contents of which are incorporated herein by reference.

FIELD

Embodiments described herein relate generally to a memory device and a variable resistance element.

BACKGROUND

The research and development of a resistance change type memory as a novel memory device have been promoted. In the resistance change type memory, a variable resistance element is used as a memory element.

DETAILED DESCRIPTION

Embodiments

In general, according one embodiment, a memory device includes: a memory cell including a variable resistance element and connected between a word line and a bit line; and a control circuit configured to control an operation of the memory cell. The variable resistance element includes: a first layer including a first compound including oxygen; a second layer including a second compound including oxygen; and a third layer between the first layer and the second layer.

Resistance change elements and memory devices according to embodiments will be described with reference to FIG. 1 to FIG. 8.

Hereinafter, the embodiments will be described in detail with reference to the accompanying drawings. In the description below, elements having the same functions and structures are denoted by like reference numerals.

In addition, in the embodiments below, when structural elements (e.g. word lines WL, bit lines BL, various voltages and signals) having reference numerals with subscripts of numerals/alphabetic characters for distinction are not distinguished from each other, expressions (reference signs) are used in which such numerals/alphabetic characters are omitted.

(1) Configuration

Figure 1:
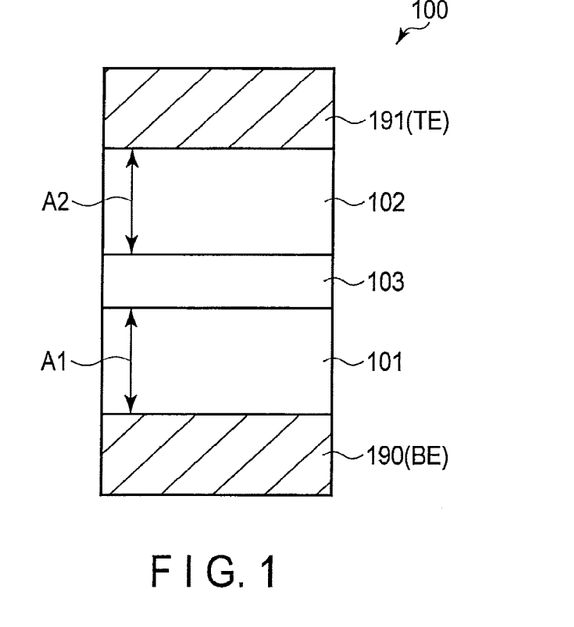
FIG. 1 and FIG. 2 are views for describing configuration examples of a variable resistance element of an embodiment.
Figure 2:
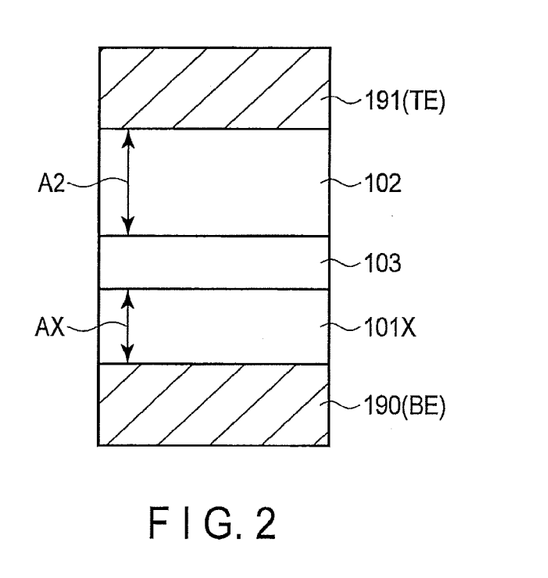

Referring to FIG. 1 and FIG. 2, configuration examples of a variable resistance element of an embodiment will be described.

FIG. 1 is a cross-sectional view illustrating a configuration of the variable resistance element of this embodiment.

As illustrated in FIG. 1, in this embodiment, a variable resistance element (also referred to as "resistance change element" or "resistance change type memory element") 100 includes two switch layers (also referred to as "active layers") 101 and 102 and a barrier layer 103. The barrier layer 103 is interposed between the two switch layers 101 and 102.

A multilayer body (multilayer film) including the switch layers 101 and 102 and barrier layer 103 is disposed between two electrodes 190 and 191. The switch layer 101 is disposed on the electrode 190 side. The switch layer 102 is disposed on the electrode 191 side. The material of the electrode 191, 192 is, for example, titanium nitride (TiN).

In the description below, for the purpose of clearer description, the electrode 190 is referred to as "bottom electrode 190", and the electrode 191 is referred to as "top electrode 191". Hereinafter, the bottom electrode 190 side is referred to as a "BE" side, and the top electrode 191 side is referred to as a "TE" side. Besides, for the purpose of clearer description, the switch layer 101 on the bottom electrode 190 side is referred to as "lower switch layer 101", and the switch layer 102 on the top electrode 191 side is referred to as "upper switch layer 102".

Each of the switch layers 101 and 102 is a compound layer including oxygen.

The material of the switch layer 101, 102 is, for example, a metal oxide or a metal oxynitride.

For example, at least one material selected from among titanium oxide (TiO), titanium oxynitride (TiON), tantalum oxide (TaO) and tungsten oxide (WO) is used for the switch layer 101, 102.

Besides, an oxide including at least two of titanium, tantalum and tungsten, or an oxynitride including at least two of titanium, tantalum and tungsten may be used for the switch layer 101, 102. A multilayer film consisting of the above-described plural oxides and/or oxynitrides may be used for the switch layer 101, 102.

The barrier layer 103 is, for example, a tunnel barrier layer. For example, the film thickness of the barrier layer 103 is less than the film thickness of each of the switch layers 101 and 102.

The material of the barrier layer 103 is, for example, a semiconductor or an oxide.

For example, at least one material selected from among amorphous silicon (a-Si), amorphous silicon germanium (a-SiGe), amorphous germanium (a-Ge), aluminum oxide (AlO), silicon oxide (SiO), hafnium oxide (HfO) and the like is used as the material of the barrier layer 103.

For example, in the example of FIG. 1, the material (e.g. $TiO_2$) of the lower switch layer 101 is the same as the material of the upper switch layer 102. In addition, a film thickness A1 of the lower switch layer 101 is equal to a film thickness A2 of the upper switch layer 102.

FIG. 2 is a cross-sectional view illustrating a modification of the variable resistance element of FIG. 1. The material of the lower switch layer 101X may be different from the material of the upper switch layer 102.

For example, TiON is used for a lower switch layer 101X, and $TiO_2$ is used for the upper switch layer 102.

A film thickness AX of the lower switch layer 101X may be different from the film thickness A2 of the upper switch layer 102. For example, the film thickness AX of a lower switch layer (TiON layer) 101X is less than the film thickness A2 of the upper switch layer ($TiO_2$ layer) 102. Besides, the film thickness AX of the lower switch layer 101X may be greater than the film thickness A2 of the upper switch layer 102.

The variable resistance element 100 (100X) of FIG. 1 (or FIG. 2) is a surface switch type variable resistance element. In the variable resistance element 100 of this embodiment, a tunnel barrier between the two electrodes 190 and 191 (between the barrier layer 103 and switch layer 101, 102) is modulated by a movement of oxygen vacancies in the switch layer 101, 102.

As a result, the resistance value (resistance state) of the variable resistance element 100 of this embodiment varies.

Hereinafter, for example, the variable resistance element 100 as in this embodiment is also referred to as VMCO (Vacancy-Modulated Conductive Oxide) element.

The variable resistance element of this embodiment has such a configuration that the barrier layer 103 is interposed between the two switch layers 101 and 102.

Thereby, compared to a variable resistance element including one switch layer, the variable resistance element of this embodiment can increase the range of resistance values which one element can take.

Accordingly, a memory device (resistance change type memory), which uses the variable resistance element of this embodiment as a memory element, can secure a wide memory window. As a result, the variable resistance element of this embodiment can realize multilevel data storage of the memory element (variable resistance element).

In the meantime, in the present embodiment, the materials of the switch layers, barrier layer and electrodes are not limited to the above-described materials, if the materials and combinations thereof can realize a change of the resistance value of the element by the movement of oxygen vacancies due to the application of a voltage.

(2) Principle and Characteristics

Figure 3:
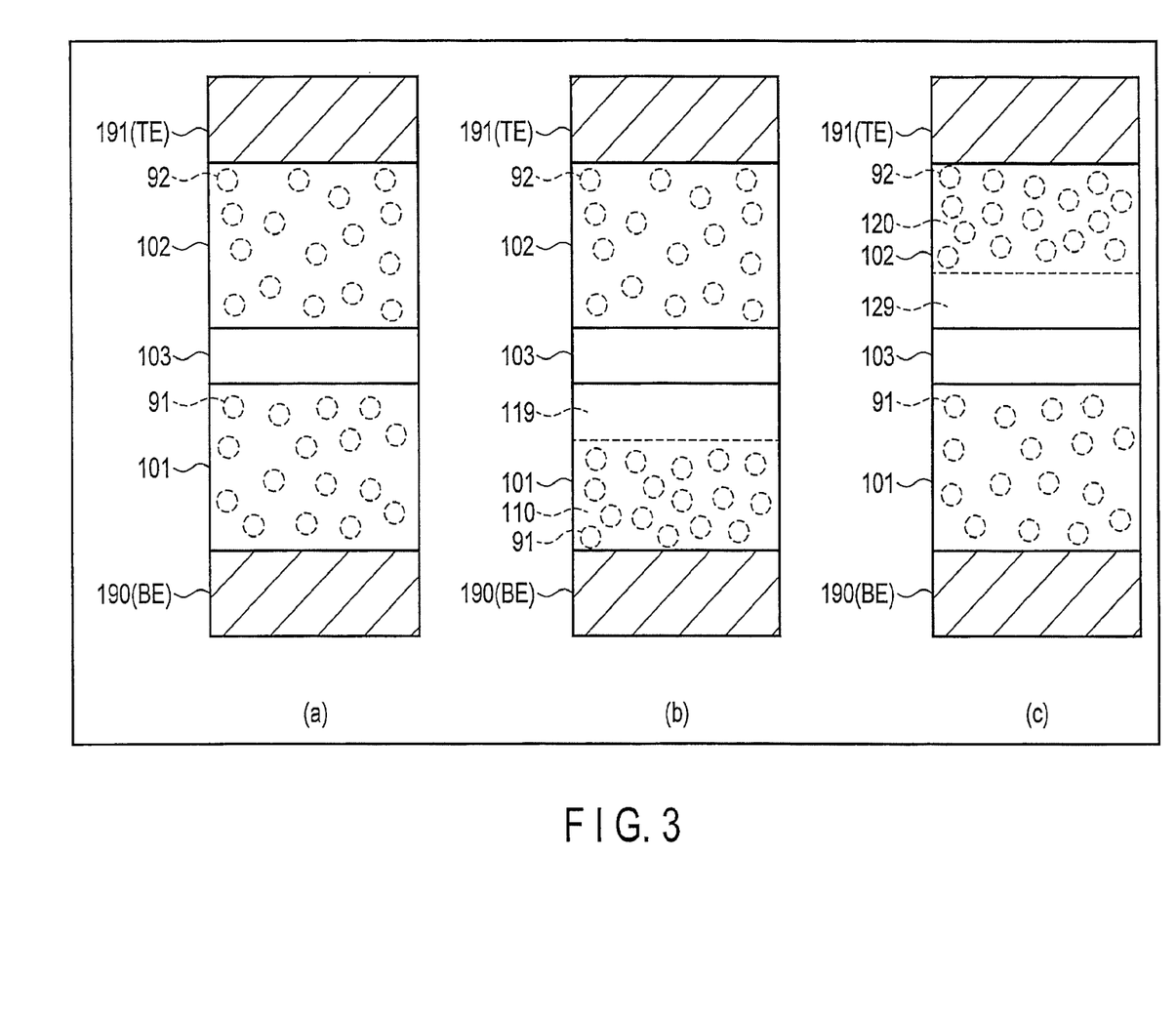
FIG. 3 is a view for explaining the principle of the variable resistance element of the embodiment.
Figure 4:
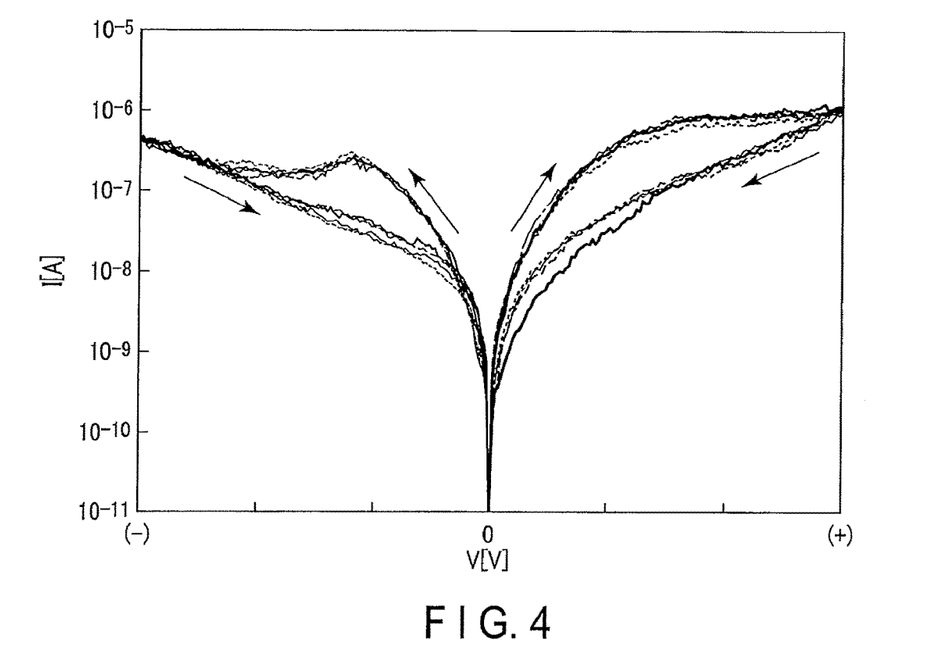
FIG. 4 and FIG. 5 are views for describing the characteristics of the variable resistance element of the embodiment.
Figure 5:
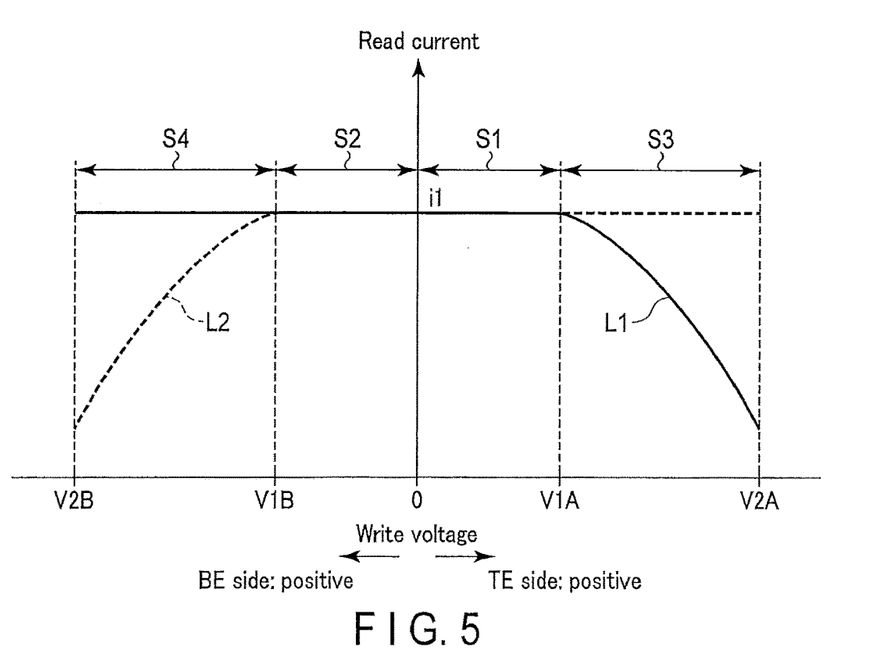

Referring to FIG. 3, FIG. 4 and FIG. 5, the principle and characteristics of the variable resistance element of the present embodiment will be described.

FIG. 3 is a schematic view for explaining the principle of the change of resistance state of the variable resistance element of the embodiment.

In the variable resistance element, the resistance state (resistance value) of the element changes by the application of a voltage to the variable resistance element.

In the variable resistance element including the switch layers and barrier layer, the resistance state of the variable resistance element changes according to whether the switch layer is in a set state or in a reset state.

By the application of a voltage, the state of the switch layer changes from the set state to reset state, or changes from the reset state to set state. The resistance value of the layer (multilayer body, element) in the reset state is higher than the resistance value of the layer in the set state.

Hereinafter, an operation for setting the state of the switch layer to the set state is referred to as "set operation", and an operation for setting the state of the switch layer to the reset state is referred to as "reset operation".

Besides, as a tendency of the VMCO type variable resistance element, the voltage value (absolute value) for setting the state of the switch layer to the reset state is higher than the voltage value (absolute value) for setting the state of the switch layer to the set state. The voltage value for setting the state of the switch layer to the reset state is referred to as "reset voltage", and the voltage value for setting the state of the switch layer to the set state is referred to as "set voltage". For example, the voltage value (absolute value) of the reset voltage is higher than the voltage value (absolute value) of the set voltage.

The variable resistance element 100 of this embodiment includes the two switch layers 101 and 102.

Thereby, the state of the variable resistance element of this embodiment can be set to at least three states by the application of the voltage to the element.

(a) of FIG. 3 is a schematic view for describing a first state of the variable resistance element of the embodiment.

As illustrated in (a) of FIG. 3, in the first state of the variable resistance element of the embodiment, the states of both the switch layers 101 and 102 are set in the set state.

In the lower switch layer 101 that is in the set state, oxygen vacancies 91 are distributed in the entirety of the layer 101. Thus, the lower switch layer 101 has a relatively low resistance state (resistance value).

In the upper switch layer 102 that is in the set state, oxygen vacancies 92 are distributed in the entirety of the layer 102. Thus, the upper switch layer 102 has a relatively low resistance state (resistance value).

In the present embodiment, when both the switch layers 101 and 102 in the variable resistance element 100 are set in the set state, the variable resistance element 100 has a first resistance state.

(b) of FIG. 3 is a schematic view for describing a second state of the variable resistance element of the embodiment.

As illustrated in (b) of FIG. 3, in the second state of the variable resistance element of the embodiment, the lower switch layer 101 on the bottom electrode 190 side is set in the reset state, and the upper switch layer 102 on the top electrode 191 side is set in the set state.

In the lower switch layer 101 that is in the reset state, oxygen vacancies 91 are unevenly distributed on the electrode 190 side. In this case, in the lower switch layer 101, there occur a region (hereinafter, also referred to as "high-density region") 110 where the oxygen vacancies 91 are densely distributed, and a region (hereinafter, also referred to as "low-density region") 119 where the oxygen vacancies 91 hardly exist.

The region 119 is provided in a region near the lower switch layer 101 and barrier layer 103. The region 119 exists between the region 110 and barrier layer 103.

By a modulation of the tunnel barrier due to the region 119, the electrical conduction between the lower switch layer 101 and barrier layer 103 lowers. As a result, the resistance state of the lower switch layer 101 becomes higher than the resistance state of the upper switch layer 102.

In this manner, in the present embodiment, when the lower switch layer 101 in the variable resistance element 100 is in the reset state and the upper switch layer 102 is in the set state, the variable resistance element 100 has a second resistance state.

(c) of FIG. 3 is a schematic view for describing a third state of the variable resistance element of the embodiment.

As illustrated in (c) of FIG. 3, in the third state of the variable resistance element of the embodiment, the lower switch layer 101 is set in the set state, and the upper switch layer 102 is set in the reset state.

In the upper switch layer 102 that is in the reset state, oxygen vacancies 92 are unevenly distributed on the electrode 191 side. In this case, in the upper switch layer 102, there occur a region 120 where the oxygen vacancies 92 are densely distributed, and a region 129 where the oxygen vacancies 92 hardly exist.

The region 129 is provided in a region near the upper switch layer 102 and barrier layer 103. The region 129 exists between the region 120 and barrier layer 103.

As described above, by a modulation of the tunnel barrier due to the region 129, the resistance state of the upper switch layer 102 becomes higher than the resistance state of the lower switch layer 101.

Therefore, in the present embodiment, when the lower switch layer 101 in the variable resistance element 100 is in the set state and the upper switch layer 102 is in the reset state, the variable resistance element 100 has a third resistance state.

In this manner, the variable resistance element of the present embodiment can take the three resistance states in accordance with the set state/reset state of the two switch layers 101 and 102.

For example, the resistance value of the variable resistance element 100 in the first resistance state is lower than the resistance value of the variable resistance element 100 in the second resistance state and the resistance value of the variable resistance element 100 in the third resistance state.

The large/small relationship between the resistance value of the variable resistance element in the second resistance state and the resistance value of the variable resistance element in the third resistance state varies depending on the film thicknesses and materials of the switch layers 101 and 102.

FIG. 4 is a view for describing the characteristics of the variable resistance element of the embodiment.

FIG. 4 is a graph showing voltage-current characteristics (V-I characteristics) of the variable resistance element of the embodiment. In FIG. 4, the abscissa axis of the graph corresponds to a voltage, and the ordinate axis of the graph corresponds to a current. In FIG. 4, the current is indicated by an absolute value.

In FIG. 4, the bias state of positive polarity ("+" side in FIG. 4) in the variable resistance element is a voltage bias state in which the top electrode side of the variable resistance element is set at a high potential and the bottom electrode side is set at a low potential (hereinafter, also referred to as "positive bias state"). In FIG. 4, the bias state of negative polarity ("−" side in FIG. 4) in the variable resistance element is a voltage bias state in which the bottom electrode side of the variable resistance element is set at a high potential and the top electrode side is set at a low potential (hereinafter, also referred to as "negative bias state").

In the variable resistance element used in the measurement of the V-I characteristics of FIG. 4, a TiON layer is used for the lower switch layer 101, an $SiO_2$ layer is used for the barrier layer 103, and a $TiO_2$ layer is used for the upper switch layer 102. TiN layers are used for the bottom electrode 190 and top electrode 191 of the variable resistance element 100.

A description is given of a case in which a voltage of positive polarity was applied to the variable resistance element of this embodiment (a case in which the top electrode side was set at a high potential).

As illustrated in FIG. 4, a current flows in the variable resistance element of this embodiment by the application of the voltage of positive polarity to the variable resistance element.

As the voltage value (absolute value) of the applied voltage increases, the current value of the current becomes greater.

If the voltage value (absolute value) of the applied voltage reaches a certain voltage value on the positive polarity side, the state of the upper switch layer 102 on the top electrode side changes from the set state to the reset state. At this time, the state of the lower switch layer 101 is the set state.

For example, if the upper switch layer 102 enters the reset state, the current value of the current flowing in the variable resistance element is substantially saturated.

In the variable resistance element including the upper switch layer 102 that is in the reset state, if the voltage value of the applied voltage is lowered from a certain voltage value to 0 V, the current value of the current decreases with a tendency that is different from the tendency of the variation of the current value at the time when the voltage value of the applied voltage was increased from 0 V to a certain voltage value. This indicates that even if the application of the voltage is stopped in the positive bias state of the variable resistance element, the reset state of the upper switch layer 102 is maintained.

A description is given of a case in which a voltage of negative polarity was applied to the variable resistance element of this embodiment (a case in which the bottom electrode side was set at a high potential).

As illustrated in FIG. 4, a current flows in the variable resistance element of this embodiment by the application of the voltage of negative polarity to the variable resistance element.

As the voltage value (absolute value) of the applied voltage increases, the current value of the current becomes greater.

If the voltage value (absolute value) of the applied voltage reaches a certain voltage value on the negative polarity side, the state of the lower switch layer 101 on the bottom electrode side changes from the set state to the reset state. At this time, the state of the upper switch layer 102 is the set state.

If the lower switch layer 101 enters the reset state, the current value of the current flowing in the variable resistance element is substantially saturated.

In the variable resistance element including the lower switch layer 101 that is in the reset state, if the voltage value of the applied voltage is lowered from a certain voltage value (absolute value) to 0 V, the current value of the current varies with a tendency that is different from the tendency of the variation of the current value at the time when the voltage value of the applied voltage was increased from 0 V to a certain voltage value. This indicates that even if the application of the voltage is stopped in the negative bias state of the variable resistance element, the reset state of the lower switch layer 101 is maintained.

Besides, in the variable resistance element of FIG. 4, since the material of the lower switch layer 101 is different from the material of the upper switch layer 102, the shape of I-V characteristics of the positive polarity and the shape of I-V characteristics of the negative polarity become asymmetric. If the material of the lower switch layer 101 is the same as the material of the upper switch layer 102, the shape of I-V characteristics of the positive polarity and the shape of I-V characteristics of the negative polarity become substantially symmetric.

In addition, in FIG. 4, because of the difference in material between the switch layers 101 and 102, the voltage value (absolute value) at which the lower switch layer 101 enters the reset state is different from the voltage value (absolute value) at which the upper switch layer 102 enters the reset state. For example, the voltage value (absolute value) at which the lower switch layer 101 enters the reset state is lower than the voltage value (absolute value) at which the upper switch layer 102 enters the reset state.

FIG. 5 is a view for describing the characteristics of the variable resistance element of the embodiment.

FIG. 5 is a graph showing a relationship between a write voltage and a read current in a case in which, with respect to the variable resistance element of this embodiment, a read current was passed through the variable resistance element which was set in a certain resistance state by a certain write voltage. In FIG. 5, the abscissa axis of the graph corresponds to a voltage value of a write voltage, and the ordinate axis of the graph corresponds to a current value of a read current.

The right side of the graph of FIG. 5 (a range in which "TE" is the positive side) corresponds to a write voltage in a case in which the top electrode is set at a higher potential than the bottom electrode. The left side of the graph of FIG. 5 (a range in which "BE" is the positive side) corresponds to a write voltage in a case in which the bottom electrode is set at a higher potential than the top electrode.

In FIG. 5, a solid line L1 in the graph indicates a read current (hereinafter, also referred to as "read current L1") in a case in which the top electrode side is set at a high potential. A broken line L2 in the graph indicates a read current (hereinafter, also referred to as "read current L2") in a case in which the bottom electrode side is set at a high potential.

When the variable resistance element of this embodiment is used as a memory element of a resistance change type memory, data stored in the variable resistance element (the resistance state of the variable resistance element) is judged based on the read current flowing through the variable resistance element when a positive voltage is applied to the top electrode and the read current flowing through the variable resistance element when a positive voltage is applied to the bottom electrode.

As shown in FIG. 5, in a range S1 in which the write voltage is 0 V to voltage value V1A, the lower switch layer 101 is set in the set state. In a range S2 in which the write voltage is 0 V to voltage value V1B, the upper switch layer 102 is set in the set state. In addition, in the range S1, the upper switch layer 102 is set in the set state. In the range S2, the lower switch layer 101 is set in the set state.

Therefore, in the range S1 and range S2 (the range between the voltage value V1A and voltage value V1B), both the lower switch layer 101 and the upper switch layer 102 are set in the set state.

In this case, as described above, the variable resistance element 100 of this embodiment has the first resistance state.

In the ranges S1 and S2, a current value i1 of the read current L1 is substantially equal to the current value of the read current L2.

In the case in which a positive voltage is applied to the top electrode (TE), if a write voltage of a voltage value exceeding a certain voltage value (absolute value) V1A is applied to the top electrode 191, the upper switch layer 102 is set in the reset state. In this case, the variable resistance element 100 of this embodiment has the third resistance state.

In accordance with an increase of the write voltage from the voltage value V1A to voltage value V2A, the uneven distribution of oxygen vacancies in the upper switch layer 102 becomes conspicuous (the region 129 in part (c) of FIG. 3 becomes larger). Thus, the resistance value of the variable resistance element increases.

Thereby, as indicated by the solid line L1, the current value of the read current L1 in the case in which the top electrode TE side is at the high potential decreases in accordance with the increase of the voltage value of the write voltage.

As regards the read current L1 in the case in which the top electrode TE side is at the high potential, the state (set state) of the lower switch layer 101 does not substantially contribute to the variation of the read current L1 on the top electrode TE side.

On the other hand, even if the write voltage with which the top electrode TE becomes positive is applied, the set state of the lower switch layer 101 is maintained. Therefore, as indicated by the broken line L2, in a range S3, the current value of the read current L2 in the case in which the bottom electrode BE side is at the high potential does not substantially change from the value of the read current L2 in the range S1. For example, in the ranges S1 and S3, the read current L2 has the current value i1.

In the range S3, the current value i1 of the read current L2 is higher than the current value of the read current L1.

In the case in which a positive voltage is applied to the bottom electrode (BE), if a write voltage of a voltage value exceeding a certain voltage value (absolute value) V1B is applied to the bottom electrode 190, the lower switch layer 101 is set in the reset state. In this case, the variable resistance element 100 of this embodiment has the second resistance state.

In accordance with an increase of the write voltage from the voltage value V1B to voltage value V2B, the uneven distribution of oxygen vacancies in the lower switch layer 101 becomes greater, and thereby the resistance value of the variable resistance element 100 increases.

Thereby, as indicated by the broken line L2, the current value of the read current L2 decreases in accordance with the increase of the voltage value (absolute value) of the write voltage.

As regards the read current L2 in the case in which the bottom electrode BE side is at the high potential, the state (set state) of the upper switch layer 102 does not substantially contribute to the variation of the read current L2 on the bottom electrode BE side.

On the other hand, even if the write voltage with which the bottom electrode BE side becomes positive is applied, the set state of the upper switch layer 102 is maintained. Therefore, as indicated by the solid line L1, in a range S4, the current value of the read current L1 on the top electrode TE side does not substantially change from the value of the read current L1 in the range S2. For example, in the ranges S2 and S4, the read current L1 has the current value i1.

In the range S4, the current value i1 of the read current L1 is higher than the current value of the read current L2.

In this manner, in the present embodiment, the data stored in the variable resistance element 100 that is used as the memory element can be judged based on the large/small relative relationship between the read current L1 in the variable resistance element that is in the positive bias state and the read current L2 in the variable resistance element that is in the negative bias state, and based on the current values of the read currents L1 and L2.

When the number of switch layers in the variable resistance element is one, the variation ranges of resistance, which this variable resistance element can take, correspond to the range S1 and range S3 in FIG. 5.

As in the present embodiment, when the variable resistance element includes two switch layers, the variation ranges of resistance, which the variable resistance element of this embodiment can take, correspond to the ranges S1, S2, S3 and S4 in FIG. 5.

In addition, in this embodiment, the range from the voltage value V1A to voltage value V2A, or the range from the voltage value V1B to voltage value V2B, the current value of the read current can be modulated by the control of the voltage value of the write voltage.

As has been described above, compared to a general VMCO type variable resistance element, the variable resistance element 100 of this embodiment can obtain approximately double the variation range of resistance values. It becomes easier to allocate data of two bits or more to variable resistance values of the variable resistance element.

As a result, in the memory device using the variable resistance element of this embodiment as the memory element, it becomes easier to enable one memory element to store multilevel data.

(3) Applied Examples

Figure 6:
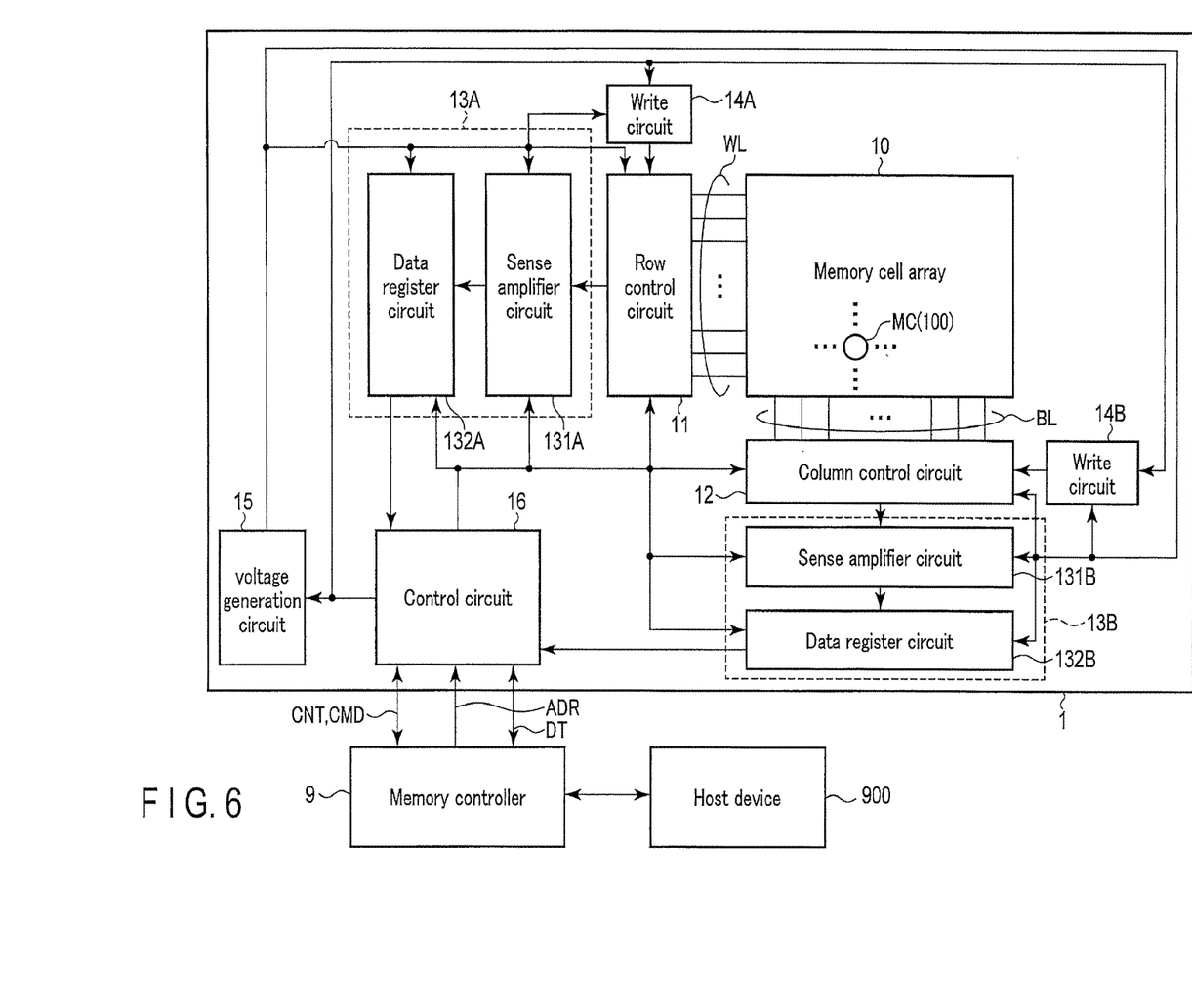
FIG. 6, FIG. 7 and FIG. 8 are views for describing configuration examples of a memory device of the embodiment.
Figure 7:
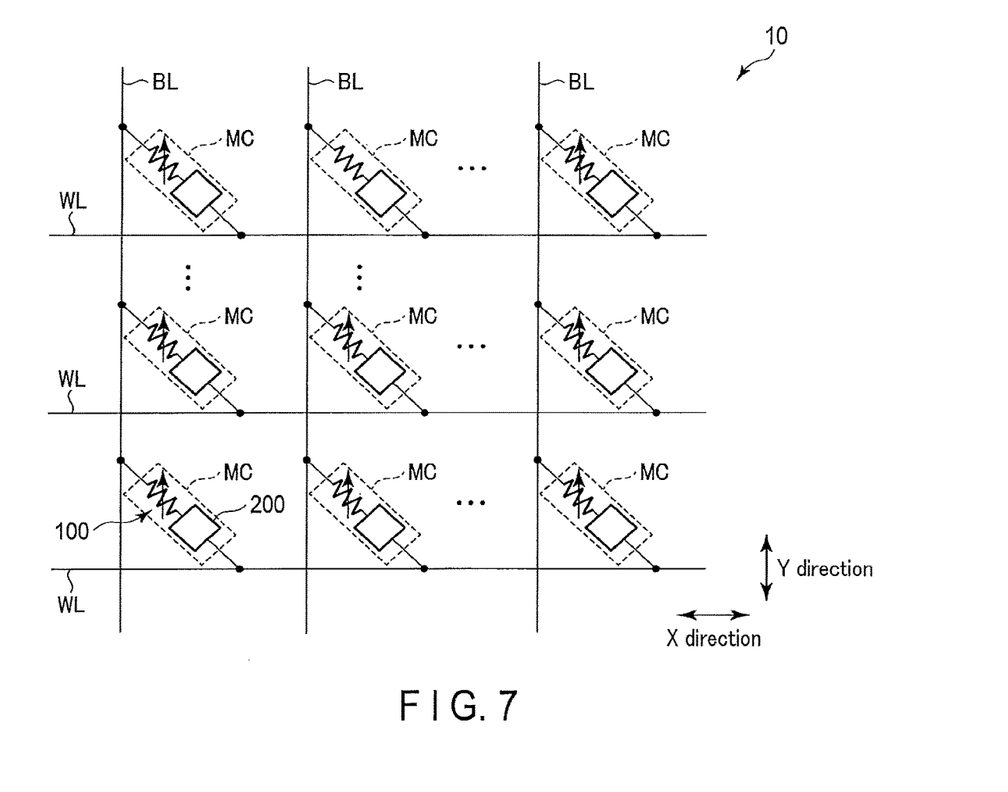
Figure 8:
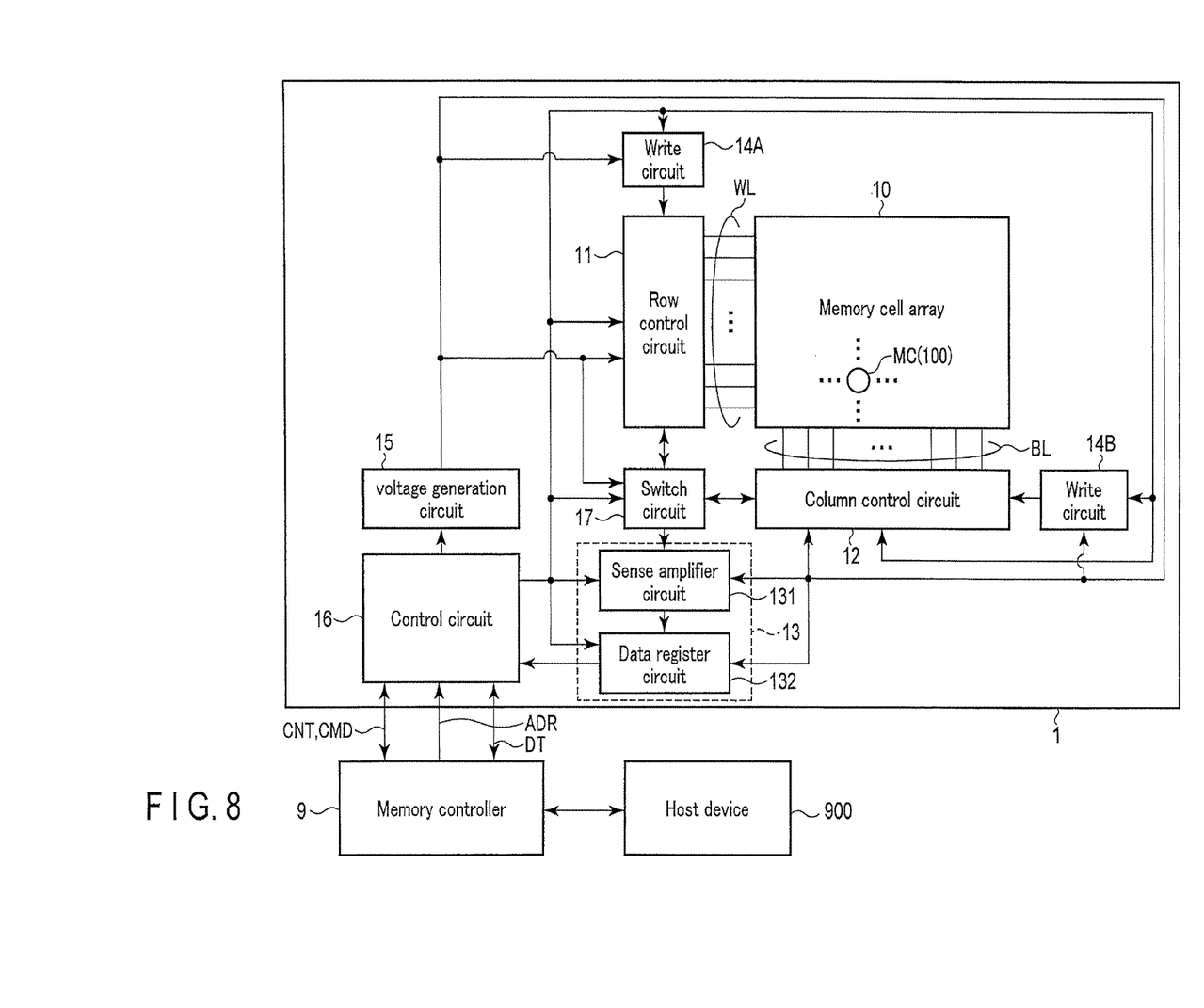

Referring to FIG. 6, FIG. 7 and FIG. 8, the resistance change type memory (memory device) of the present embodiment will be described.

(a) Configuration Example

FIG. 6 is a block diagram illustrating one example of a system including the resistance change type memory of the present embodiment.

As illustrated in FIG. 6, the memory system includes, for example, a memory device 1 of this embodiment, a memory controller 9 and a host device 900.

The host device 900 can issue a request for various operations, such as write (storage) of data, read of data and erase of data, to the memory device 1 via the memory controller 9. For example, the host device 900 is at least one device selected from among a mobile terminal, a smartphone, a game console, a processor, a server, a personal computer, etc.

The resistance change type memory 1 is directly or indirectly connected to the memory controller 9. For example, the resistance change type memory 1 is a storage class memory or a main memory.

The memory controller 9 is directly or indirectly connected to the host device 900 via a connection terminal, a connector or a cable.

The memory controller 9 can control the operation of the memory device 1. The memory controller 9 includes a processor, a built-in memory, an interface circuit, etc.

Based on a request from the host device 900, the memory controller 9 issues a command. The memory controller 9 sends the issued command to the resistance change type memory 1.

The resistance change type memory 1 executes an operation corresponding to the command from the memory controller 9. In the memory system, the resistance change type memory 1 executes a predetermined operation by the control from the other device 9, 900.

For example, the resistance change type memory 1 and memory controller 9 may be provided in one device. The memory controller 9 may be provided in the host device 900. The resistance change type memory 1 of this embodiment may be a memory in the memory controller 9 or in the host device 900.

The resistance change type memory 1 of this embodiment includes a memory cell array 10, a row control circuit 11, a column control circuit 12, read circuits 13A and 13B, write circuits 14A and 14B, a voltage generation circuit 15, a control circuit 16 and the like.

The memory cell array 10 includes a plurality of memory cells MC. The memory cell MC includes the above-described variable resistance element 100 of this embodiment.

FIG. 7 is an equivalent circuit diagram illustrating an example of the internal configuration of the memory cell array 10 of the resistance change type memory of this embodiment.

The resistance change type memory of this embodiment includes the memory cell array 100 of, for example, a cross-point configuration.

As illustrated in FIG. 7, in the memory cell array 10, a plurality of word lines WL are arranged in a Y direction. Each word line WL extends in an X direction. In the memory cell array 10, a plurality of bit lines BL are arranged in the X direction. Each bit line BL extends in the Y direction.

Each memory cell MC is disposed at an intersection position between the bit line BL and word line WL. One end of the memory cell MC is connected to the bit line BL, and the other end of the memory cell MC is connected to the word line WL.

A plurality of memory cells MC arranged in the X direction are commonly connected to one word line WL. A plurality of memory cells MC arranged in the Y direction are commonly connected to one bit line BL.

The memory cell MC includes the variable resistance element 100 and a selector element 200.

In the example of FIG. 7, one end of the variable resistance element 100 is connected to the bit line BL, and the other end of the variable resistance element 100 is connected to one end of the selector element 200. The other end of the selector element 200 is connected to the word line WL.

The variable resistance element 100 has the configuration illustrated in FIG. 1 or FIG. 2. For example, the top electrode 191 side (switch layer 102 side) of the variable resistance element 100 is connected to the word line WL via the selector element 200. The bottom electrode 190 side (switch layer 101 side) of the variable resistance element 100 is connected to the bit line BL.

The selector element 200 is one element selected from among a diode, a switching element (e.g. a variable resistance element), a capacitor, etc. For example, the selector element 200 is an element including a GeTe layer.

At times of operations (e.g. a write operation and a read operation) of the memory device, the selector element 200 can suppress noise (e.g. a current flowing between memory cells) between a selected cell and an unselected cell.

In FIG. 6, the row control circuit 11 controls a plurality of rows (e.g. word lines WL) of the memory cell array 10.

The row control circuit 11 includes a row decoder, a word line driver, a switch circuit and the like.

For example, an address of a memory cell to be selected (hereinafter referred to as "select address") ADR is supplied from the control circuit 16 to the row control circuit 11. The row control circuit 11 sets in a selected state a word line WL based on a decoded result of the select address. The row control circuit 11 sets in an unselected state a word line other than the selected word line WL.

Hereinafter, the word line set in the selected state is referred to as "selected word line". The word line other than the selected word line is referred to as "unselected word line".

The column control circuit 12 controls a plurality of columns (e.g. bit lines BL) of the memory cell array 10.

The column control circuit 12 includes a column decoder, a bit line driver, a switch circuit and the like.

For example, the select address ADR is supplied from the control circuit 16 to the column control circuit 12. The column control circuit 12 sets in a selected state a column (e.g. at least one bit line) based on a decoded result of the select address. The column control circuit 12 sets in an unselected state a bit line other than the selected bit line BL. Hereinafter, the bit line set in the selected state is referred to as "selected bit line". The bit line other than the selected bit line is referred to as "unselected bit line".

The resistance change type memory of this embodiment includes two read circuits (also referred to as "read control circuits" or "read drivers") 13A and 13B.

First and second read circuits 13 (13A and 13B) execute various controls for a read operation (data read). The read circuit 13A, 13B senses a current (or voltage) of the bit line BL at the time of the read operation, thereby reading data in the memory cell MC.

The first read circuit 13A is electrically connected to the word lines WL of the memory cell array 10 via the row control circuit 11.

The first read circuit 13A includes at least a sense amplifier circuit 131A and a data register circuit 132A.

The sense amplifier circuit 131A senses a current flowing in the selected word line (or a variation in potential of the selected word line WL) at the time of the read operation. The sense amplifier circuit 131A amplifies a sensed result. The sense amplifier circuit 131A sends a signal (read signal) corresponding to the amplified sensed result to the data register circuit 132A.

The data register circuit 132A holds the read signal from the sense amplifier circuit 131A as a read result (a judgment result of the resistance state) relating to the switch layer on the word line (row) side of the memory cell MC.

The second read circuit 13B is electrically connected to the bit lines BL of the memory cell array 10 via the column control circuit 12.

The second read circuit 13B includes at least a sense amplifier circuit 131B and a data register circuit 132B.

The sense amplifier circuit 131B senses a current flowing in the selected bit line (or a variation in potential of the selected bit line BL) at the time of the read operation. The sense amplifier circuit 131B amplifies a sensed result. The sense amplifier circuit 131B sends a read signal corresponding to the amplified sensed result to the data register circuit 132B.

The data register circuit 132B holds the read signal from the sense amplifier circuit 131B as a read result (a judgment result of the resistance state) relating to the switch layer on the bit line (column) side of the memory cell MC.

In the present embodiment, data is read from the memory cell including the variable resistance element 100 of this embodiment, based on the read results of the read circuits 13A and 13B of the row side and the column side.

The write circuits (also referred to as "write control circuits" or "write drivers") 14A and 14B execute various controls for a write operation (data write). For example, the write circuit 14A, 14B includes a voltage source (or a current source), a latch circuit and the like.

At the time of the write operation, the write circuits 14 (14A and 14B) apply write voltages (set voltage and reset voltage) to the selected word line WL and selected bit line BL in accordance with data that is to be written to the memory cell. Thereby, the resistance state of the variable resistance element 100 functioning as the memory element is changed, and data is written to the memory cell MC.

The write circuit 14A is connected to the word lines WL of the memory cell array 10 via the row control circuit 11. At the time of the write operation, the write circuit 14A controls the potential of the selected word line (and unselected word line) WL.

The write circuit 14B is connected to the bit lines BL of the memory cell array 10 via the column control circuit 12. At the time of the write operation, the write circuit 14B controls the potential of the selected bit line (and unselected bit line) BL.

The voltage generation circuit 15 generates various voltages (e.g. a reset voltage and a set voltage) for the operation of the resistance change type memory 1, by using the power supply voltage provided from the external device. The voltage generation circuit 15 supplies the generated voltages to the respective circuits 11, 12, 13 and 14.

The control circuit (also referred to as "state machine", "sequencer" or "internal controller") 16 controls the operations of the respective circuits 11 to 15 in the resistance change type memory 1, based on a control signal CNT and a command CMD.

For example, the control circuit 16 includes an input/output circuit, a logical circuit and a decoder circuit.

The command CMD is a signal indicative of an operation which is to be executed by the resistance change type memory 1. For example, the control signal CNT is a signal for controlling an operation timing between the memory controller 9 and resistance change type memory 1, and an operation timing of the inside of the resistance change type memory 1.

The control circuit 16 sends the select address ADR, which is received from the memory controller 9, to the row control circuit 11 and column control circuit 12.

The control circuit 16 sends data DT, which is received from the memory controller 9, to the write circuits 14 as write data.

The control circuit 16 receives read signals from the read circuits 13A and 13B. The control circuit 16 judges the data in the selected cell MC, based on the two read signals.

The control circuit 16 sends the judgment result to the memory controller 9 as read data.

As described above, in the resistance change type memory 1 of the embodiment of FIG. 6, the read circuits 13A and 13B are provided on the row side and column side of the memory cell array 10, respectively.

Thereby, the resistance change type memory of this embodiment can read data from the memory cell MC including the variable resistance element 100 which includes the two switch layers 101 and 102.

(b) Operation Examples

Hereinafter, referring to FIG. 1 to FIG. 7, examples of the operation of the resistance change type memory of the present embodiment will be described.

<Read Operation>

Here, a read operation of the resistance change type memory of this embodiment will be described.

For example, when a request for data read was issued from the host device 900 to the memory controller 9, the memory controller 9 sends the read command CMD to the resistance change type memory 1. The memory controller 9 sends the select address ADR and control signal CNT as well as the read command CMD.

The resistance change type memory 1 of this embodiment reads data from the memory cell of the select address ADR, based on the read command CMD and control signal CNT.

Based on the select address ADR, the row control circuit 11 selects one word line WL among the plural word lines. Based on the select address ADR, the column control circuit 12 selects one bit line WL among the plural bit lines.

Thereby, the memory cell connected to the selected word line and selected bit line is selected.

In the read operation of the resistance change type memory of the embodiment of FIG. 6, the read signal from the word line side of the selected cell and the read signal from the bit line side of the selected cell are acquired by the read circuit 13A on the row side of the memory cell array and the read circuit 13B on the column side of the memory cell array.

In the resistance change type memory of this embodiment, the read operation has an operation sequence in which the read from the word line side of the selected cell and the read from the bit line side of the selected cell are successively executed.

For example, the resistance change type memory of this embodiment executes read of the word line side of the selected cell (read for one of the switch layers).

The row-side read circuit 13A applies a positive voltage to the selected word line. For example, the column-side read circuit 13B sets the selected bit line in an electrically floating state. Alternatively, the column-side read circuit 13B applies 0 V to the selected bit line.

Thereby, a read current is supplied to the selected cell MC.

In the row-side read circuit 13A, the sense amplifier circuit 131A senses the current value of the read current of the selected word line WL. The sense amplifier circuit 131A amplifies the sensed signal.

The sense amplifier circuit 131A outputs the amplified signal to the data register circuit 132A as the read result of the word line side of the selected cell.

The data register circuit 132A holds the signal from the sense amplifier circuit 131A.

After the read from the word line side of the selected cell, the resistance change type memory 1 of this embodiment executes read from the bit line side of the selected cell (read for the other switch layer).

The column-side read circuit 13B applies a positive voltage to the selected bit line. For example, the row-side read circuit 13A sets the selected word line in an electrically floating state. Alternatively, the row-side read circuit 13A applies 0 V to the selected word line.

Thereby, a read current is supplied to the selected cell MC.

In the column-side read circuit 13B, the sense amplifier circuit 131B senses the current value of the read current of the selected bit line BL. The sense amplifier circuit 131B amplifies the sensed signal.

The sense amplifier circuit 131B outputs the amplified signal to the data register circuit 132B as the read result of the bit line side of the selected cell.

The data register circuit 132B holds the signal from the sense amplifier circuit 131B.

For example, as described with reference to FIG. 5, when the switch layer 102 on the word line side (top electrode side) is set in the set state and the switch layer 101 on the bit line side (bottom electrode side) is set in the set state, the current value of the read current on the word line side is relatively high and the current value of the read current on the bit line side is relatively high.

Here, for the purpose of clearer description, the current value of the read current on the word line side due to the switch layer 102 that is in the set state is referred to as "first current value" (e.g. the current value i1 in FIG. 5). In addition, the current value of the read current on the bit line side due to the switch layer 101 that is in the set state is referred to as "second current value". Depending on the materials and film thicknesses of the switch layers 101 and 102, there is a case in which the second current value is substantially equal to the first current value, and there is a case in which the second current value is different from the first current value.

When the switch layer 102 on the word line side (top electrode side) is set in the reset state and the switch layer 101 on the bit line side (bottom electrode side) is set in the set state, the current value of the read current on the word line side is lower than the first current value, and the current value of the read current on the bit line side is higher than the current value of the read current on the word line side. In this case, for example, the current value of the read current on the bit line side has the second current value. Here, the current value of the read current on the word line side due to the switch layer 102 in the reset state is referred to as "third current value".

When the switch layer 102 on the word line side (top electrode side) is set in the set state and the switch layer 101 on the bit line side (bottom electrode side) is set in the reset state, the current value of the read current on the bit line side is lower than the first current value, and the current value of the read current on the word line side is higher than current value of the read current on the bit line side. In this case, for example, the current value of the read current on the word line side has the first current value. Here, the current value of the read current on the bit line side due to the switch layer 101 in the reset state is referred to as "fourth current value"

The row-side data register 132A and column-side data register 132B send the held read signal on the word line side and the held read signal on the bit line side to the control circuit 16.

The control circuit 16 judges the data in the selected cell MC, based on the two read signals (the sensed results of the current values of the read currents on the selected word line side and selected bit line side). Thereby, the control circuit 16 determines the read data.

In this manner, in the present embodiment, the data is read from the selected cell.

The control circuit 16 sends the read data DT to the memory controller 9. The memory controller 9 transfers the received data DT to the host device 900.

As described above, the read operation of the resistance change type memory of the present embodiment is completed.

<Write Operation>

Here, a write operation of the resistance change type memory of the present embodiment will be described.

For example, when a request for data write was issued from the host device 900 to the memory controller 9, the memory controller 9 sends the write command CMD to the resistance change type memory 1. The memory controller 9 sends the select address ADR, data DT to be written to the memory cell, and the control signal CNT, as well as the write command CMD.

Based on the write command CMD and control signal CNT, the resistance change type memory 1 writes the data DT, which is to be written, to the memory cell MC corresponding to the select address ADR.

Based on the select address ADR, the row control circuit 11 selects one word line among the plural word lines. Based on the select address ADR, the column control circuit 12 selects one bit line among the plural bit lines.

Thereby, the memory cell connected to the selected word line and selected bit line is selected.

In accordance with the write data, the potential of the selected word line and the potential of the selected bit line are controlled.

When the state of the lower switch layer 101 is changed from the set state to the reset state, the reset voltage exceeding the positive voltage value V1B in FIG. 5 is applied to the selected bit line, and 0 V is applied to the selected word line.

When the state of the lower switch layer 101 is changed from the reset state to the set state, the set voltage of approximately the positive voltage value V1A in FIG. 5 is applied to the selected word line, and 0 V is applied to the selected bit line.

When the state of the upper switch layer 102 is changed from the set state to the reset state, the reset voltage exceeding the voltage value V1A is applied to the selected word line, and 0 V is applied to the selected bit line.

When the state of the upper switch layer 102 is changed from the reset state to the set state, the set voltage of approximately the voltage value V1B is applied to the selected bit line, and 0 V is applied to the selected word line.

Thereby, in this embodiment, the states of the two switch layers 101 and 102 of the variable resistance element 100 are controlled.

As a result, in the resistance change type memory of the present embodiment, predetermined data can be written to the variable resistance element 100 functioning as the memory element.

As described above, the write operation of the resistance change type memory of this embodiment is completed.

(c) Modification

FIG. 8 is a block diagram illustrating a modification of the resistance change type memory of the present embodiment.

As illustrated in FIG. 8, in a resistance change type memory of this modification, one read circuit 13 is connected to the row control circuit 11 and column control circuit 12 via a switch circuit 17.

Like the example of FIG. 6, the read circuit 13 includes a sense amplifier circuit 131 and a data register circuit 132. For example, the data register circuit 132 has a storage capacity which can hold read signals (read results) of two read operations.

The read circuit 13 is commonly used for the read relating to the word line side of the selected cell and the read relating to the bit line side of the selected cell.

In the read of the word line side of the selected cell (read for one of the switch layers), the switch circuit 17 electrically connects the read circuit 13 to the row control circuit 11. The switch circuit 17 electrically disconnects the read circuit 13 from the column control circuit 12.

Thereby, the read circuit 13 is electrically connected to the selected word line WL via the switch circuit 17 and row control circuit 11.

The sense amplifier circuit 131 senses the current of the selected word line and amplifies the signal of the sensed result. The data register circuit 132 holds the signal from the sense amplifier circuit 131.

In the read of the bit line side of the selected cell (read for the other switch layer), the switch circuit 17 electrically connects the read circuit 13 to the column control circuit 12. The switch circuit 17 electrically disconnects the read circuit 13 from the row control circuit 11.

Thereby, the read circuit 13 is electrically connected to the selected bit line BL via the switch circuit 17 and column control circuit 12.

The sense amplifier circuit 131 senses the current of the selected bit line and amplifies the signal of the sensed result. The data register circuit 132 holds the signal from the sense amplifier circuit 131.

The data register circuit 132 sends the held read signal on the word line side and the held read signal on the bit line side to the control circuit 16.

The control circuit 16 judges the data in the selected cell MC, based on the two read results. Thereby, the control circuit 16 determines the read data.

In the present modification, one read circuit 13 is commonly used for the read on the word line side of the memory cell and the read on the bit line side of the memory cell. The switch circuit 17 effects switching between the connection between the read circuit 13 and word lines WL, and the connection between the read circuit 13 and bit lines BL.

Thereby, one read circuit can execute both the read on the word line side of the memory cell and the read on the bit line side of the memory cell.

Therefore, also in this resistance change type memory of the modification, the data can be read from the memory cell MC including the variable resistance element 100 which includes the two switch layers 101 and 102.

(4) Summary

As illustrated in FIG. 1, the variable resistance element of the present embodiment has such a configuration that the barrier layer 103 is interposed between the two switch layers 101 and 102.

Thereby, the variable resistance element of this embodiment can increase the variation range of resistance values of the variable resistance element.

As a result, the memory device using the variable resistance element of this embodiment as the memory element can relatively advantageously realize multilevel data storage (storage of two or more bits) of the memory element.

The magnitude of the read current can be modulated by varying the film thicknesses of the two switch layers 101X and 102, like the variable resistance element 100 of the configuration of FIG. 2 in the present embodiment.

Thereby, the memory device of the present embodiment can adjust the value of the read current to a more proper value in accordance with the interconnect length of the word line and the interconnect length of the bit line (the memory capacity of the memory cell array).

Moreover, like the variable resistance element of the configuration of FIG. 2, nitrogen is added to the oxide layer of one switch layer 101X. Thereby, the variable resistance element of the present embodiment can increase the amount (number) of oxygen vacancies in the switch layer 101X.

Thereby, the variable resistance element of the present embodiment can reduce the switch voltage (set voltage/reset voltage) of the variable resistance element.

As a result, the memory device of this embodiment can enhance the operation speed and can reduce the power consumption.

As has been described above, the variable resistance element of the present embodiment and the memory device of this embodiment can improve the characteristics of the memory.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A memory device comprising:
a memory cell including a variable resistance element and connected between a word line and a bit line;
a control circuit configured to control an operation of the memory cell,
a row control circuit connected to the word line;
a first read circuit connected to the row control circuit;
a column control circuit connected to the bit line; and
a second read circuit connected to the column control circuit,
wherein the variable resistance element includes:
a first layer including a first compound including oxygen;
a second layer including a second compound including oxygen; and
a third layer between the first layer and the second layer, and
wherein at a time of a read operation of data from the memory cell,
the first read circuit is configured to detect a first signal which is output from the memory cell to the word line,
the second read circuit is configured to detect a second signal which is output from the memory cell to the bit line, and
the control circuit is configured to judge the data in the memory cell, based on the first signal and the second signal.

2. The device according to claim 1, wherein the variable resistance element is configured to have one resistance state among a first resistance state, a second resistance state and a third resistance state in accordance with application of a voltage to the first layer and the second layer.

3. The device according to claim 1, wherein the first compound is different from the second compound.

4. The device according to claim 1, wherein the first compound includes nitrogen.

5. The device according to claim 1, wherein a thickness of the first layer is different from a thickness of the second layer.

6. The device according to claim 1, wherein each of the first compound and the second compound is at least one selected from the group consisting of titanium oxide, titanium oxynitride, tantalum oxide and tungsten oxide.

7. The device according to claim 1, wherein a material of the third layer is at least one selected from the group consisting of amorphous silicon, amorphous silicon germanium, amorphous germanium, aluminum oxide, silicon oxide and hafnium oxide.

8. The device according to claim 1, wherein the variable resistance element further includes:
a first electrode,
a second electrode, and
a stacked body disposed between the first electrode and the second electrode, the stacked body including the first layer, the second layer and the third layer.

9. A memory device comprising:
a memory cell including a variable resistance element and connected between a word line and a bit line;
a control circuit configured to control an operation of the memory cell;
a row control circuit connected to the word line;
a column control circuit connected to the bit line;
a switch circuit connected to the row control circuit and the column control circuit; and
a read circuit connected to the switch circuit,
wherein the variable resistance element includes:
a first layer including a first compound including oxygen;
a second layer including a second compound including oxygen; and
a third layer between the first layer and the second layer, and
wherein at a time of a read operation of data from the memory cell,
the switch circuit is configured to connect the read circuit to the row control circuit in a first detection process in the read operation, and the read circuit is configured to detect a first signal which is output from the memory cell to the word line,
the switch circuit is configured to connect the read circuit to the column control circuit in a second detection process in the read operation, and the read circuit is configured to detect a second signal which is output from the memory cell to the bit line, and
the control circuit is configured to judge the data in the memory cell, based on the first signal and the second signal.

10. The device according to claim 9, wherein the variable resistance element is configured to have one resistance state among a first resistance state, a second resistance state and a third resistance state in accordance with application of a voltage to the first layer and the second layer.

11. The device according to claim 9, wherein the first compound is different from the second compound.

12. The device according to claim 9, wherein the first compound includes nitrogen.

13. The device according to claim 9, wherein a thickness of the first layer is different from a thickness of the second layer.

14. The device according to claim 9, wherein each of the first compound and the second compound is at least one selected from the group consisting of titanium oxide, titanium oxynitride, tantalum oxide and tungsten oxide.

15. The device according to claim 9, wherein a material of the third layer is at least one selected from the group consisting of amorphous silicon, amorphous silicon germanium, amorphous germanium, aluminum oxide, silicon oxide and hafnium oxide.

16. The device according to claim 9, wherein the variable resistance element further includes:
a first electrode,
a second electrode, and
a stacked body disposed between the first electrode and the second electrode, the stacked body including the first layer, the second layer and the third layer.

* * * * *